United States Patent [19]

Yamamoto et al.

[11] 4,275,259

[45] Jun. 23, 1981

[54] THERMAL CONVERTER

[75] Inventors: Noboru Yamamoto, Nagoya; Akira Ohmura, Kasugai, both of Japan

[73] Assignee: NGK Insulators, Ltd., Nagoya, Japan

[21] Appl. No.: 82,239

[22] Filed: Oct. 5, 1979

[30] Foreign Application Priority Data

Oct. 14, 1978 [JP] Japan ................................ 53/126423

[51] Int. Cl.³ ............................................. H01L 35/28
[52] U.S. Cl. ..................................... 136/209; 136/210; 136/224; 136/225
[58] Field of Search ............... 136/204, 209, 210, 224, 136/225

[56] References Cited

U.S. PATENT DOCUMENTS

| 3,006,979 | 10/1961 | Rich | 136/204 |
|---|---|---|---|
| 3,040,538 | 6/1962 | Alsing | 136/204 X |
| 3,197,342 | 7/1965 | Neild, Jr. | 136/210 |
| 3,635,037 | 1/1972 | Hubert | 136/204 X |
| 3,726,100 | 4/1973 | Widakowich | 136/203 X |
| 3,870,568 | 3/1975 | Oesterhelt et al. | 136/204 X |
| 4,125,122 | 11/1978 | Stachurski | 136/210 |

OTHER PUBLICATIONS

Toskushima et al., Journal of Materials, Science, 4 (1969), pp. 978 to 984.

Primary Examiner—Leland A. Sebastian
Attorney, Agent, or Firm—Stevens, Davis, Miller & Mosher

[57] ABSTRACT

A thermal converter is constructed with thermoelectric element composed of a honeycomb structural body having a large number of parallel channels extending therethrough and separated by thin walls, a part of the channels forming a region for flowing a high temperature fluid and the other part of the channels forming a region for flowing a low temperature fluid. A honeycomb structural body to constitute P type thermoelectric element and a honeycomb structural body to constitute N type thermoelectric element are preferably alternately arranged in a plurality of numbers.

3 Claims, 6 Drawing Figures

THERMAL CONVERTER

The present invention relates to thermal converters composed of honeycomb structural bodies having a large number of parallel channels extending therethrough and separated by thin walls.

Thermal converters utilizing Seebeck effect have been heretofore known and have been partially practically used for electric sources for the army, artificial satellites, remote places and the like. The thermal converters used for these apparatuses have the following structure. In general, a pair of P conductivity type and N conductivity type pillar-shaped thermoelectric elements 1 as shown in FIG. 1 constitutes the minimum unit and a large number of thermoelectric elements are elecrtrically connected with first junction plates 2 which are in contact with a heat absorber 5 and second junction plates 3 which are in contact with a heat sink 6 are arranged through electric insulating plates 4 and 4' respectively.

However, in order to make the efficiency of the thermoelectric element 1 in the thermal converter higher, it is necessary to make the difference of temperature between the first and the second junction plates 2 and 3 as large as possible and therefore the heat absorber 5 and the heat sink 6 having a high efficiency and a large size must be provided. Accordingly, the conventional thermal converter is complicated in structure and large in size, and is constructed by superposing different materials of the heat absorber 5, the electric insulating plate 4, the first junction plates 2, the thermoelectric element 1, the second junction plates 3, the electric insulating plate 4', the heat sink 6 and the like, so that the heat resistance at the respective superposing portions is large, and therefore it is difficult to obtain a large thermoelectric force for its size.

The thermal converter of the present invention has been obtained in order to solve such conventional drawbacks and is one which can obtain a large thermal electromotive force in spite of a small size and the thermoelectric element is composed of a honeycomb structural body having a large number of parallel channels extending therethrough and separated by thin walls and a part of the channels forms a region for flowing a high temperature fluid and another part of the channels forms a region for flowing a low temperature fluid.

For a better understanding of the invention, reference is taken to the accompanying drawings, wherein.

Figure 2:
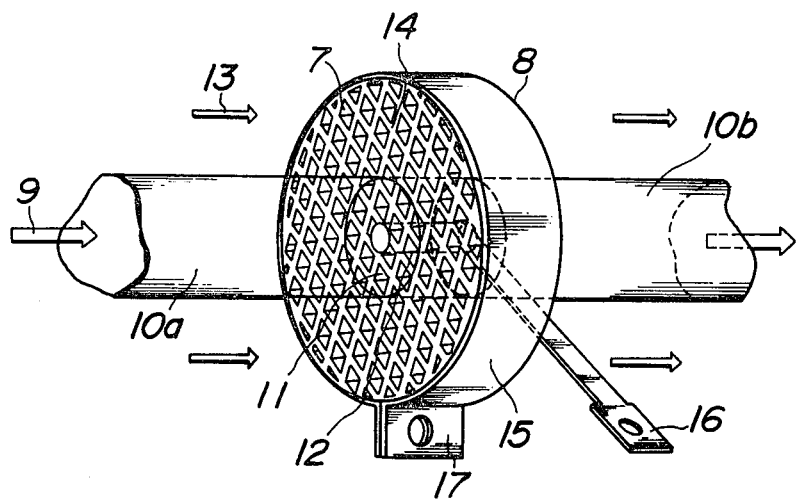
FIG. 2 is a schematic perspective view of an embodiment of the thermal converter of the present invention.

An embodiment of the present invention will be explained in detail with reference to FIG. 2.

A thermoelectric element 8 is constructed by a honeycomb structural body having a large number of parallel channels extending therethrough and separated by thin walls, and composed of silicides of transition metals, such as $CrSi_2$, $CoSi_2$, $FeSi_2$, $MnSi$, $MnSi_2$, $MoSi_2$; tellurides, such as $PbTe$, $AgSbTe$, $GeTe$; selenides, such as $PbSe$, $(W,Ta)Se_2$; antimonides, such as $ZnSb$, $CdSb$; IV Group metal alloys, such as $Ge_{0.3}Si_{0.7}$; nitrides, such as $CrN$, $ZrN$; carbides, such as $TiC$, $ZrC$; borides, such as $TiB_2$, $TaB_2$, and to the approximately center portion of the thermoelectric element 8 are connected gas tightly flowing tubes 10a and 10b to form a region 11 for flowing a high temperature fluid 9 at the center portion of the thermoelectric element 8 and an electrode 12 of the high temperature side is provided at substantially the center portion in the region 11 for flowing the high temperature fluid.

A region 14 for flowing a low temperature fluid 13, such as air and the like into the channels other than the region 11 for flowing the high temperature fluid 9 of the thermoelectric element 8 is formed and an electrode 15 of the low temperature side is formed at the region 14 for flowing the low temperature fluid 13. To the electrode 12 of the high temperature side and the electrode 15 of the low temperature side are connected the power output terminals 16 and 17 respectively. By Seebeck effect at the junction of the thermoelectric element 8 and the electrode 12 of the high temperature side and another junction of the thermoelectric element 8 and the electrode 15 of the low temperature side, the thermal electromotive force corresponding to the temperature difference between the junction of the electrode of the high temperature side and another junction of the low temperature side and the electric generating ability of the thermoelectric element 8 can be taken out. The sectional shape of the parallel channels of the thermoelectric element composed of a honeycomb structural body may be polygonal, such as trigonal, pentagonal and hexagonal other than tetragonal, and may be circular or oval and the like.

Furthermore, the thermoelectric element may be P type and N type and the region for flowing the high temperature fluid may not be necessarily at the center portion and the electrode of the low temperature side may not be necessarily at the outer circumference.

However, in any case, it is necessary that the tubes 10a and 10b for flowing the high temperature fluid 9 are connected gas or fluid tightly to the thermoelectric element so as not to flow out the high temperature fluid 9 from the flowing tubes 10a and 10b and not to contact with the region 14 for flowing the low temperature fluid 13.

Another embodiment of the present invention will be explained with reference to FIGS. 3A and 3B. P type thermoelectric element 18 and N type thermoelectric element 19 consisting of honeycomb structural bodies having a large number of parallel channels extending therethrough and composed of the above described materials are made to be a pair and the end surfaces of the partition walls of said pair of honeycomb structural bodies in the region 11 for flowing the high temperature fluid 9 at substantially the center portion are tightly bonded with an electrode 12 of the high temperature side and the partition walls of the region 14 for flowing the low temperature fluid 13 at the outer circumferential portion of said pair of honeycomb structural bodies are adhered with a heat resistant insulating adhesive 20 to form an integrally bonded body of P type thermoelectric element 18 and N type thermoelectric element 19.

Furthermore, in this case, it is important that the channels are not clogged by bonding or adhering and the region for flowing the high temperature fluid and that the region for flowing the low temperature fluid are isolated. A pair of the above described P and N bonded elements are arranged in a plurality of couples so that P type thermoelectric element 18 and N type thermoelectric element 19 are alternately positioned and heat resistant insulating packings 21 are provided between the adjacent N type thermoelectric element 19 and P type thermoelectric element 18, and between the region 11 for flowing the high temperature fluid and the region 14 for flowing the low temperature fluid, whereby all the channels in the region 11 for flowing the high temperature fluid communicate and all the channels in the region 14 for flowing the low temperature fluid communicate and further both the flowing regions are completely isolated by the heat resistant insulating adhesive 20 and the heat resistant insulating packings 21. Each circumference of a pair of N type thermoelectric element 19 and the P type thermoelectric element 18, which are connected through heat resistant insulating packings 21, is connected with the electrode 15 of the low temperature side and to the region 11 for flowing the high temperature fluid at both ends of P type and N type thermoelectric elements 18 and 19, are gas or fluid tightly connected the tubes 10a and 10b for flowing the high temperature fluid 9 and the power output terminals 16 and 17 are provided at both the ends of the thermoelectric elements 18 and 19 respectively.

Figure 3A:
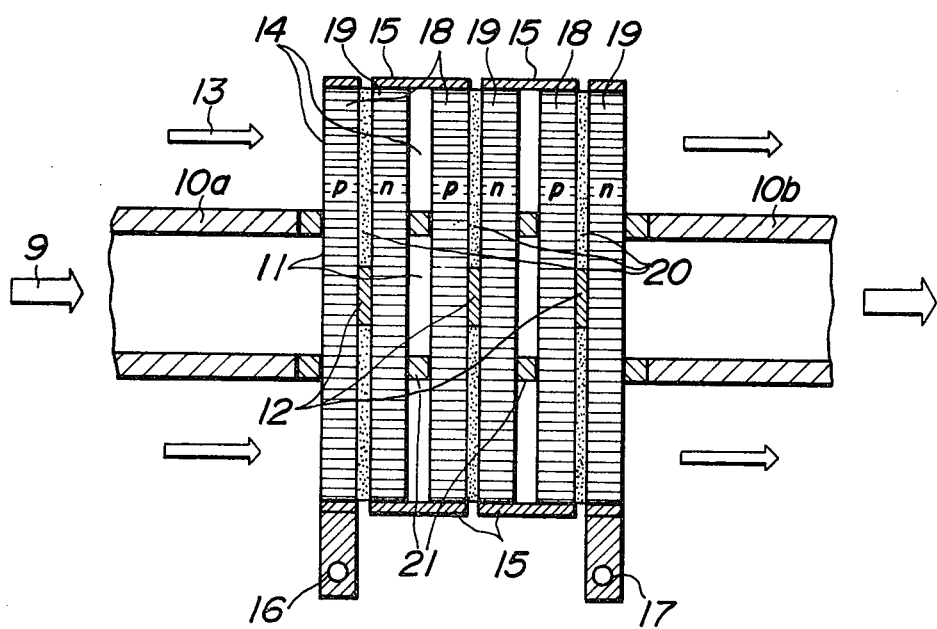
FIGS. 3A and 3B are a cross-sectional view and a perspective view of other embodiment of the thermal converter of the present invention respectively.
Figure 3B:
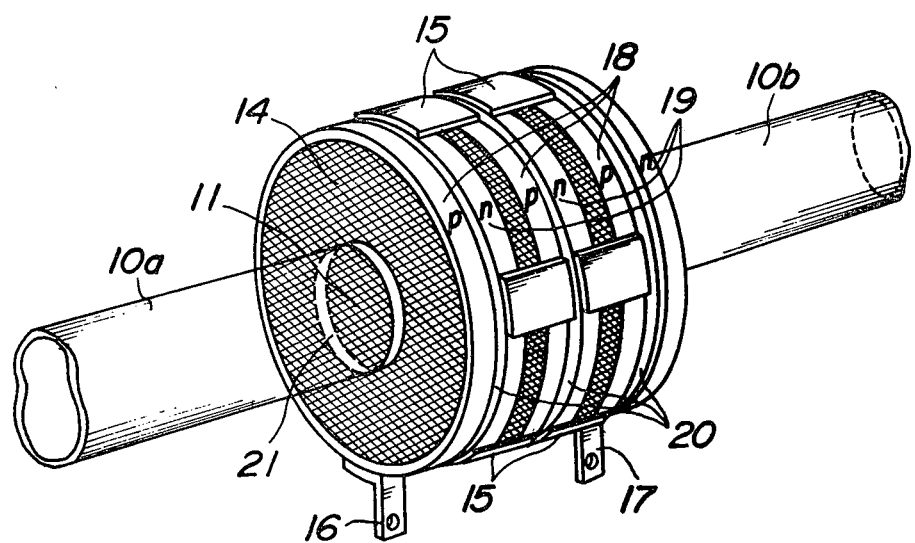
Figure 4A:
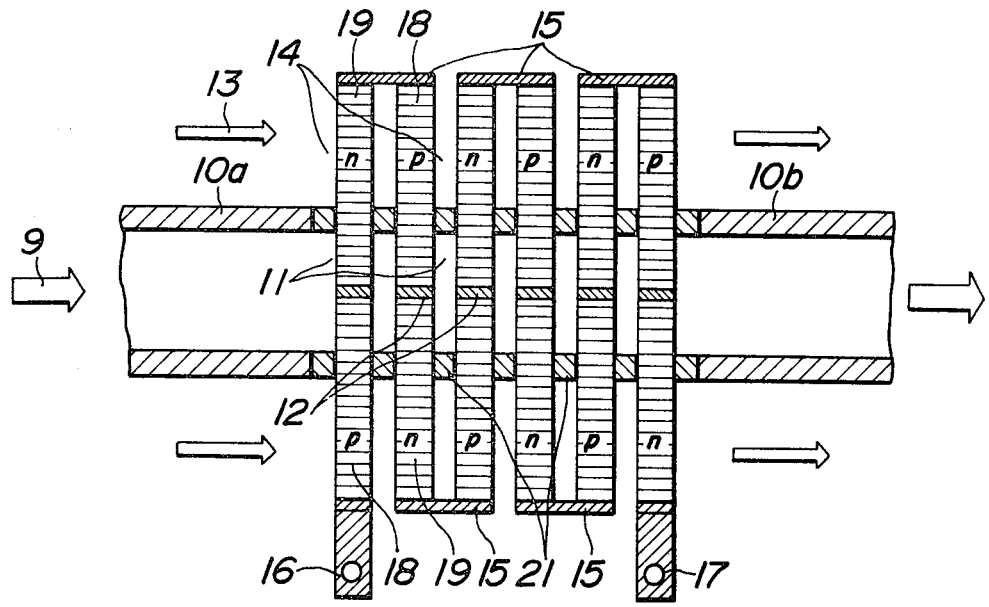
FIGS. 4A and 4B are a cross-sectional view and a perspective view of the other embodiment of the thermal converter of the present invention respectively.
Figure 4B:
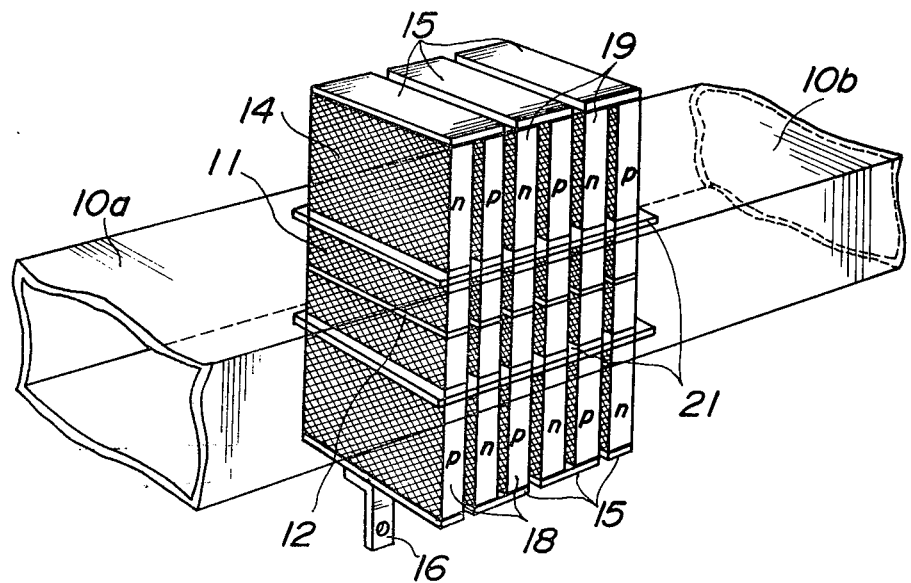

In the embodiment shown in FIGS. 3A and 3B, an explanation was made with respect to an example, wherein a region 11 for flowing the high temperature fluid is formed at substantially the center portion of P type thermoelectric element and N type thermoelectric element and the region for flowing the low temperature fluid is formed at the peripheral portion, but it is not always necessary to form the region for flowing the high temperature fluid at the center portion of P type thermoelectric element and N type thermoelectric element but as shown in FIGS. 4A and 4B, said region may be formed at the end portion. But, in this case, as shown in FIG. 4A and 4B, one side of the ends of P type thermoelectric element and N type thermoelectric element are bonded with an electrode of the high temperature side and the region 11 for flowing the high temperature fluid 9 wherein the high temperature fluid 9 flows into the channels in the vicinity of the bonding portion including the electrode 12 of the high temperature side, is preferably formed and the region 14 for flowing the low temperature fluid is formed at another end portion of P type and N type thermoelectric elements. And, as shown in FIGS. 4A and 4B, P type thermoelectric element and N type thermoelectric element are alternately connected through heat resistant insulating packings 21 and in the low temperature region, these elements are alternately connected by the electrode 15 of the low temperature side as shown in FIGS. 4A and 4B.

The present invention has the above described construction and for example, when a combustion exhaust gas having high temperature is passed through the tube for flowing the high temperature fluid and the high temperature gas is flowed into the channels in the region for flowing the high temperature fluid in P type and N type thermoelectric elements and air or water at room temperature and the like is flowed into the channels in the region for flowing the low temperature fluid, the heat absorption and the heat dissipation are effected in one thermoelectric element, so that a very large temperature difference can be obtained and therefore a large thermal electromotive force can be obtained between the terminals by Seebeck effect.

The following examples are given for the purpose of illustration of this invention and are not intended as limitations thereof.

EXAMPLE 1

As P type thermoelectric element, to 100 parts by weight of $CrSi_2$ powders having a mean grain size of $5\mu$ was added 10 parts by weight of vinyl acetate copolymer (COPONYL PH-60A, Trademark, made by The Nippon Synthetic Chemical Industry Co., Ltd.) as an organic binder and the mixture was thoroughly mixed by a kneader. This $CrSi_2$ mixture was subjected to extrusion to form a honeycomb structural body (disclosed in U.S. Pat. No. 3,824,196) having hexagonal cell shape by means of a plunger system extruder and the shaped honeycomb structural body was dried and then cut into a thickness of 5 mm and sintered in a vacuum furnace at the maximum temperature schedule of 1,350° C. for 1 hour. After sintering, both end surfaces were polished to make the thickness 3 mm. The outer shape of P type thermoelectric element composed of this honeycomb structural body was circular, the diameter was 34 mm, the pitch of the channels was 1 mm, the thickness of the partition wall between channels was 0.3 mm, the open frontal area was 70% and the weight was 4 g.

N type thermoelectric element was produced by using CoSi powders in the same manner and condition as described in P type case. The weight of this thermoelectric element was 5.4 g.

Then, the thus produced P type and N type thermoelectric elements were bonded with an electrode of the high temperature side and a heat resistant insulating adhesive as shown in FIGS. 3A and 3B. Namely, a paste obtained by adding 5 parts by weight of commercially available aluminosilicate glass powders to 95 parts by weight of $CrSi_2$ powders and adding 30% by volume of pine oil thereto as a solvent was coated 5 times by screen printing on one end surface of the partition wall of a portion of a diameter of 5 mm at the center portion of one end surface of P type thermoelectric element as the electrode of the high temperature side. A paste obtained by adding 20 parts by weight of commercially available aluminosilicate glass powders to 80 parts by weight of $Al_2O_3$ powders forming a heat resistant insulating adhesive and adding 30% by volume of pine oil as a solvent was coated 5 times by screen printing on the other portion of the end surface of the partition wall. The end surface of P type thermoelectric element coated with both the pastes and the end surface of N type thermoelectric element were superposed so that the channels in both the elements align and were fixed by a sintering jig and heat treated in a vacuum furnace at the maximum schedule at 1,300° C. for 5 minutes. Thus, the bonded body P type thermoelectric element and N type thermoelectric element was obtained. Three groups of this bonded body were prepared and connected and fixed with heat resistant insulating packings having an inner diameter of 10 mm and an outer diameter of 14 mm and made of alumina fibers as shown in FIG. 3A. As the electrode of the low temperature side, copper pieces were soldered at four portions of the outer peripheral portion of the thermoelectric elements and to the thermoelectric element of the most outside, was soldered a power output terminal of the low temperature side.

In the thus prepared thermal converter, tubes having an inner diameter of 10 mm and an outer diameter of 14 mm for flowing a high temperature fluid were gas tightly provided to the region for flowing the high temperature fluid including an electrode of the high temperature side and exhaust gas of gas flame was flowed into the channels in the region for flowing the high temperature fluid. On the other hand, 0.3 m³/min of air was flowed into the channels in the region for flowing a low temperature fluid.

Figure 1:
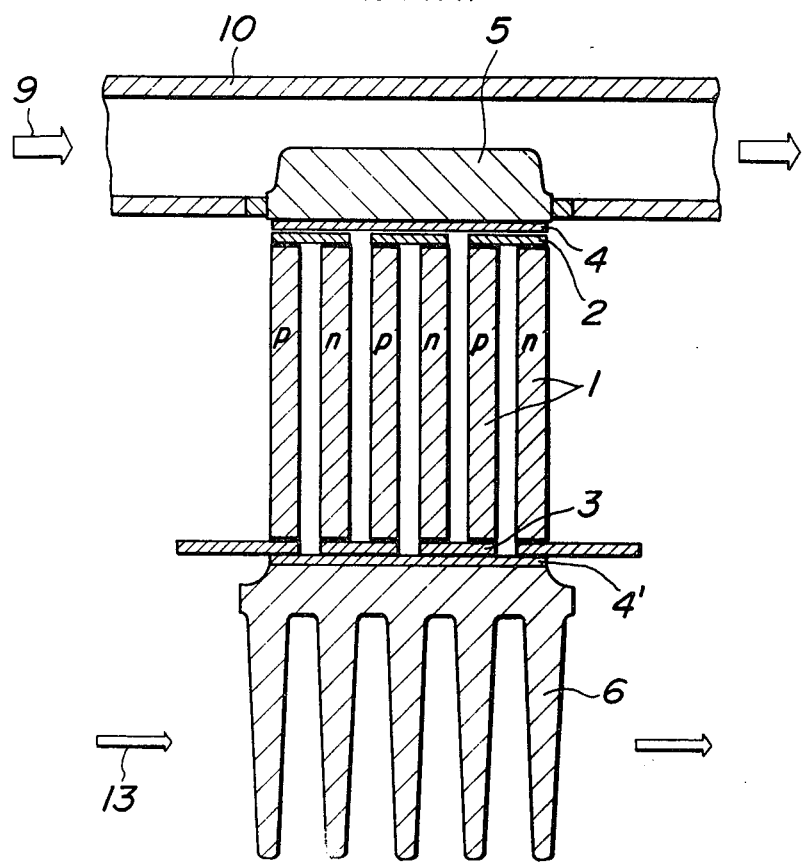
FIG. 1 is a schematic view for showing the cross-section of a conventional thermal converter.

As a comparative example, by using $CrSi_2$ as P type thermoelectric element and CoSi as N type thermoelectric element, these materials were shaped into pillar elements through cold press and the shaped materials were sintered under the same conditions as described in the production of honeycomb-shaped elements of the present invention to produce conventional pillar-shaped thermoelectric elements (3×9×30 mm) as shown in FIG. 1, in which P type thermoelectric element is 4 g and N type thermoelectric element is 5.4 g.

Three P type thermoelectric elements and three N type thermoelectric elements were alternately arranged in a row and as the electrode of the low temperature side and the electrode of the high temperature side, a copper piece and a heat resistant steel piece were bonded to the elements, respectively and to the thermoelectric elements of the most outside were soldered the power output terminals. And, at both the bonding portions were provided a heat sink and a heat absorber, which are made of aluminum, through electric insulating plates. To this apparatus, the exhaust gas of gas flame was flowed into the heat absorber at the high temperature side and 0.3 m³/min of air was flowed into the heat sink of the low temperature side. By using the thermal converter of the present invention and the conventional thermal converter, the thermal electromotive force was measured by making the temperature at the electrode portion of the high temperature side to be 1,000° C. The obtained results are shown in Table 1.

TABLE 1

|  | Thermal converter of the invention | Conventional thermal converter |
| --- | --- | --- |
| Weight of a pair of P and N type elements (g) | 9.4 | 9.4 |
| Element surface area of the region for flowing the low temperature fluid (cm² per one element) | 43 | — |
| Surface area of the heat dissipater (cm²) | — | 25 |
| Temperature at the electrode portion of the high temperature side (°C.) | 1,000 | 1,000 |
| Temperature at the electrode portion of the low temperature side (°C.) | 80 | 240 |
| Temperature difference (°C.) | 920 | 760 |
| Thermal electromotive force per one pair of P and N type elements (mV) | 148 | 105 |
| Maximum electric power per one pair of P and N type elements (mW) | 438 | 332 |

EXAMPLE 2

By using P and N type elements obtained by doping As and B to IV group alloy $Ge_{0.3}Si_{0.7}$ respectively and by doping Mn and Co to $FeSi_2$ respectively, the thermal converter having the same shape as described in Example 1 and the conventional thermal converter having the same pillar-shaped elements as described in the comparative example in Example 1 were manufactured. To the high temperature side and the low temperature side of each apparatus were flowed the exhaust gas of gas flame and 0.3 m³/min of air respectively and the measurement was effected and the obtained results are shown in Table 2.

TABLE 2

|  | $Ge_{0.3}Si_{0.7}$ | | $FeSi_2$ | |
| --- | --- | --- | --- | --- |
|  | A | B | A | B |
| Temperature at the electrode portion of the high temperature side (°C.) | 850 | 850 | 900 | 900 |
| Temperature at the electrode portion of the low temperature side (°C.) | 100 | 230 | 80 | 250 |
| Temperature difference (°C.) | 750 | 620 | 820 | 650 |
| Thermal electromotive force per one pair of P and N type elements (mV) | 257 | 207 | 360 | 286 |
| Maximum electric power per one pair of P and N type elements (mW) | 365 | 257 | 262 | 197 |

Note:
A: Thermal converter of this invention.
B: Conventional thermal converter.

As seen from the above Tables 1 and 2, the thermal converter using the thermoelectric element constituted with the honeycomb structural body of the present invention can obtain a much larger temperature difference than the conventional thermal converter, so that a much larger thermal electromotive force can be obtained.

As mentioned above, in the thermal converter using the thermoelectric element composed of the honeycomb structural body having a large number of parallel channels extending therethrough according to the present invention, the thermoelectric element itself has the function concurrently conducting the heat absorption and the heat dissipation, so that the thermal converter has a very large heat exchanging ability in a small size and there is no increase of heat resistance due to superposing different materials as in the conventional thermal converter, so that a very large temperature difference can be easily obtained. Accordingly, it is possible to obtain a large thermal electromotive force and electric power can be obtained by efficiently utilizing exhaust heat. The thermal converter of the present invention is very useful in industry.

We claim:

1. A thermal converter in which a thermoelectric element is a honeycomb structural body having a large number of parallel channels extending therethrough and separated by thin walls, a part of the parallel channels forms a region for flowing a high temperature fluid and the other part of the parallel channels forms a region for flowing a low temperature fluid.

2. The thermal converter as claimed in claim 1, wherein an electrode of the high temperature side is provided at the region for flowing the high temperature fluid and an electrode of the low temperature side is provided at the region for flowing the low temperature fluid.

3. The thermal converter as claimed in claim 1, wherein P type thermoelectric element and N type thermoelectric element, which are composed of honeycomb structural bodies having the region for flowing the high temperature fluid and the region for flowing the low temperature fluid, are alternately electrically connected in a plurality of numbers.

* * * * *